United States Patent [19]
Miley

[11] Patent Number: 5,917,330
[45] Date of Patent: Jun. 29, 1999

[54] PROBE RING HAVING ELECTRICAL COMPONENTS AFFIXED THERETO AND RELATED APPARATUS AND PROCESSES

[76] Inventor: David M. Miley, 2600 Renner Rd., Richardson, Tex. 75082

[21] Appl. No.: 08/587,432

[22] Filed: Jan. 17, 1996

[51] Int. Cl.⁶ .................................................. G01R 31/02
[52] U.S. Cl. .......................................... 324/762; 324/754
[58] Field of Search .................................. 324/754, 762, 324/763, 158.1, 73.1, 72.5, 765; 439/482; 438/14, 18; 257/40, 48

[56] References Cited

U.S. PATENT DOCUMENTS

| | | |
|---|---|---|
| 3,806,801 | 4/1974 | Bove . |
| 3,911,361 | 10/1975 | Bove et al. . |
| 4,161,692 | 7/1979 | Tarzwell . |
| 4,626,775 | 12/1986 | Cho et al. ............................... 324/754 |
| 4,719,417 | 1/1988 | Evans . |
| 4,780,670 | 10/1988 | Cherry . |
| 4,837,622 | 6/1989 | Whann et al. . |
| 4,983,907 | 1/1991 | Crowley . |
| 5,075,621 | 12/1991 | Hoyt . |
| 5,101,149 | 3/1992 | Adams et al. . |
| 5,148,103 | 9/1992 | Pasiecznik, Jr. ......................... 439/482 |
| 5,172,051 | 12/1992 | Zamborelli . |

*Primary Examiner*—Vinh P. Nguyen
*Attorney, Agent, or Firm*—R.Darryl Burke McKool Smith, P.C.

[57] ABSTRACT

An apparatus to test an integrated circuit has a plurality of contact pads electrically coupled to the integrated circuit to transfer electrical signals to and from the integrated circuit. The apparatus has a body or ring, a plurality of probes, and electrical components. The ring has a ring surface and a ring opening in the ring surface to a hollow cavity extending through the ring. The plurality of probes extend from a first location exterior of the ring to a second location over the ring opening and are affixed to the ring with an adhesive. Each probe of the plurality of probes has a contact end to electrically contact one contact pad of the plurality of contact pads. In some embodiments, at least one electrical component is secured to the ring. The at least one electrical component is electrically coupled to the plurality of contact pads. A conductive plate may also be secured to the body and be electrically coupled to at least probe of the plurality of probes and to the at least one electrical component. The ring with probes and electrical components can also be combined with a printed circuit board has

40 Claims, 8 Drawing Sheets

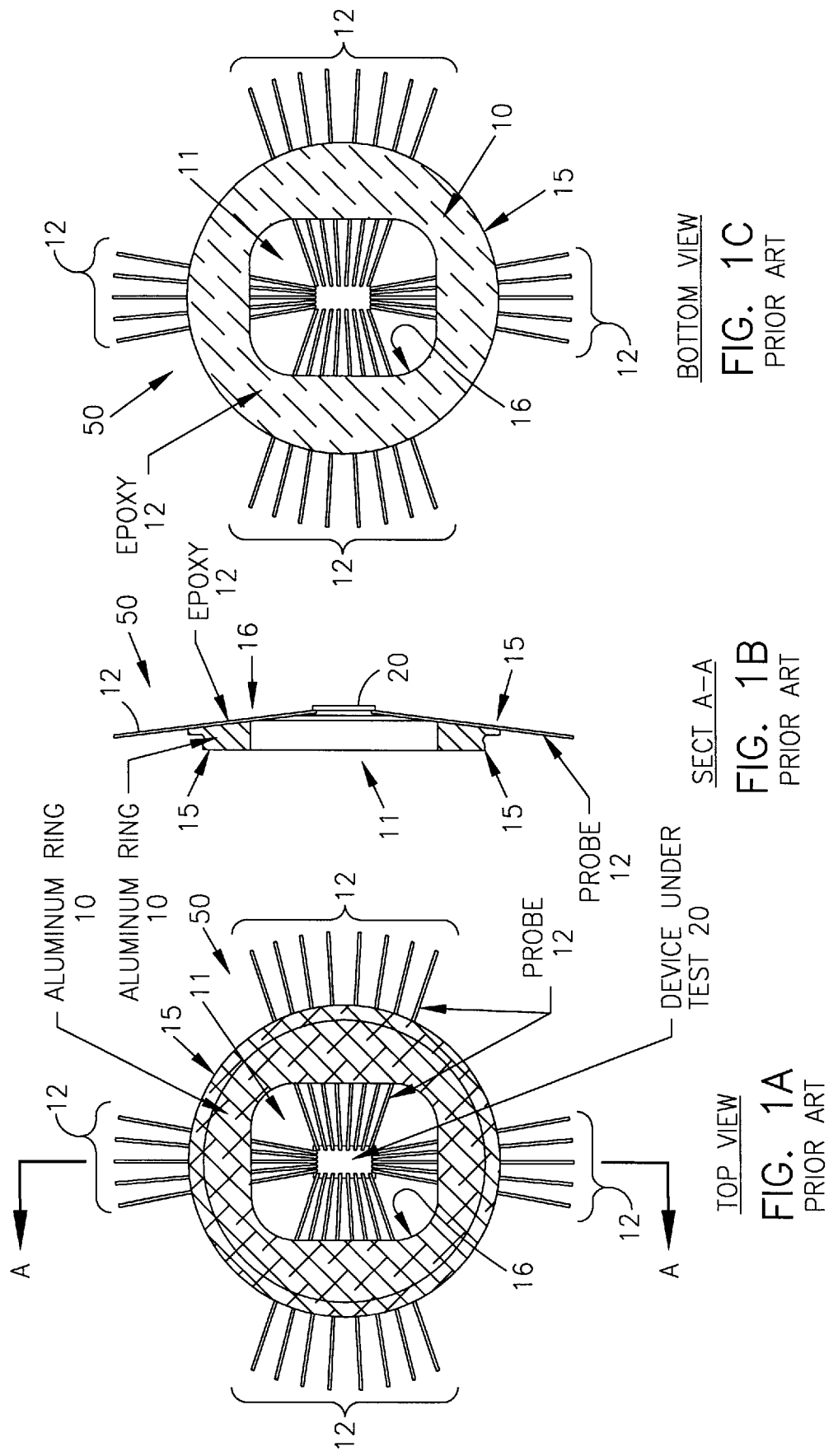

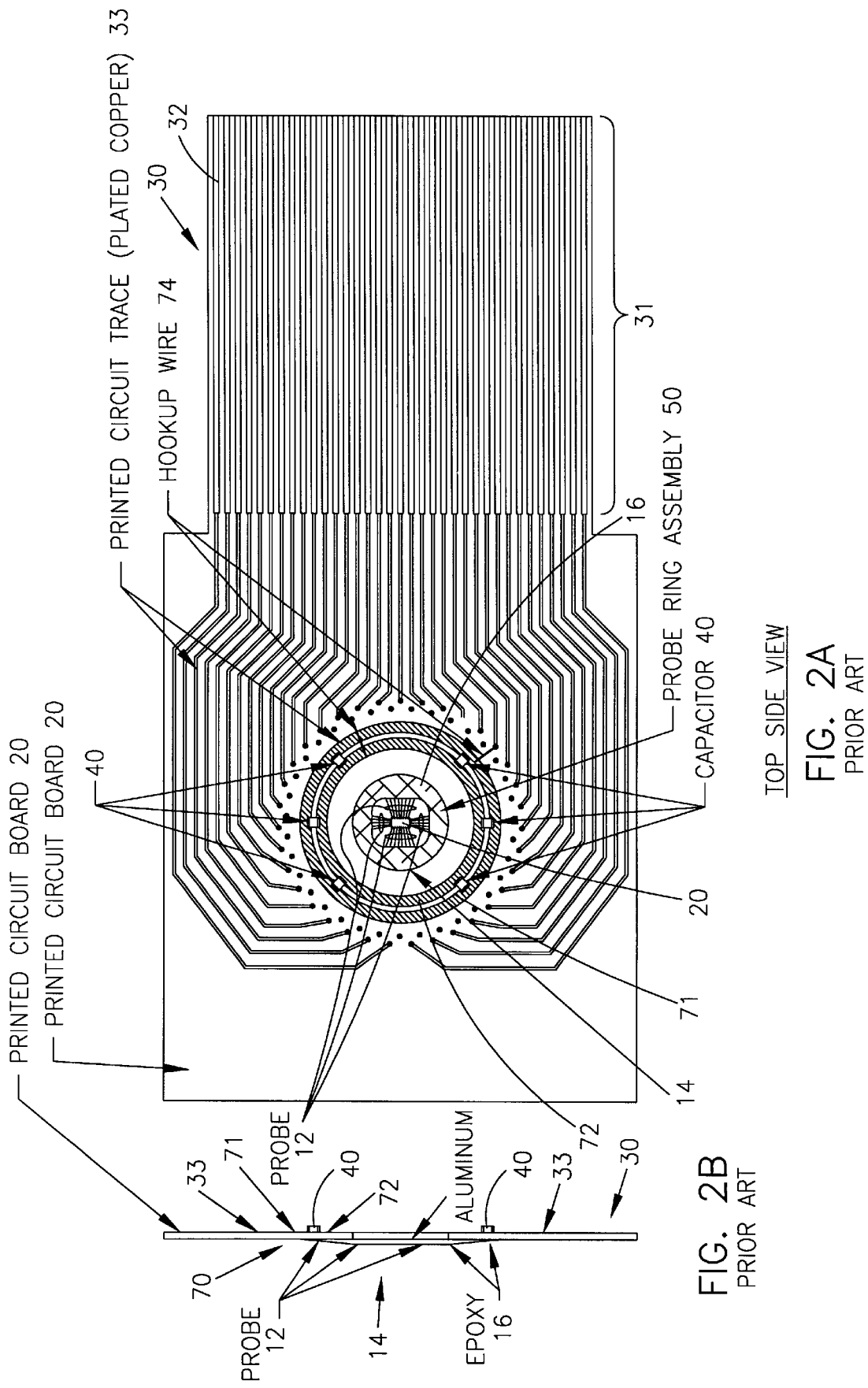

BOTTOM SIDE VIEW

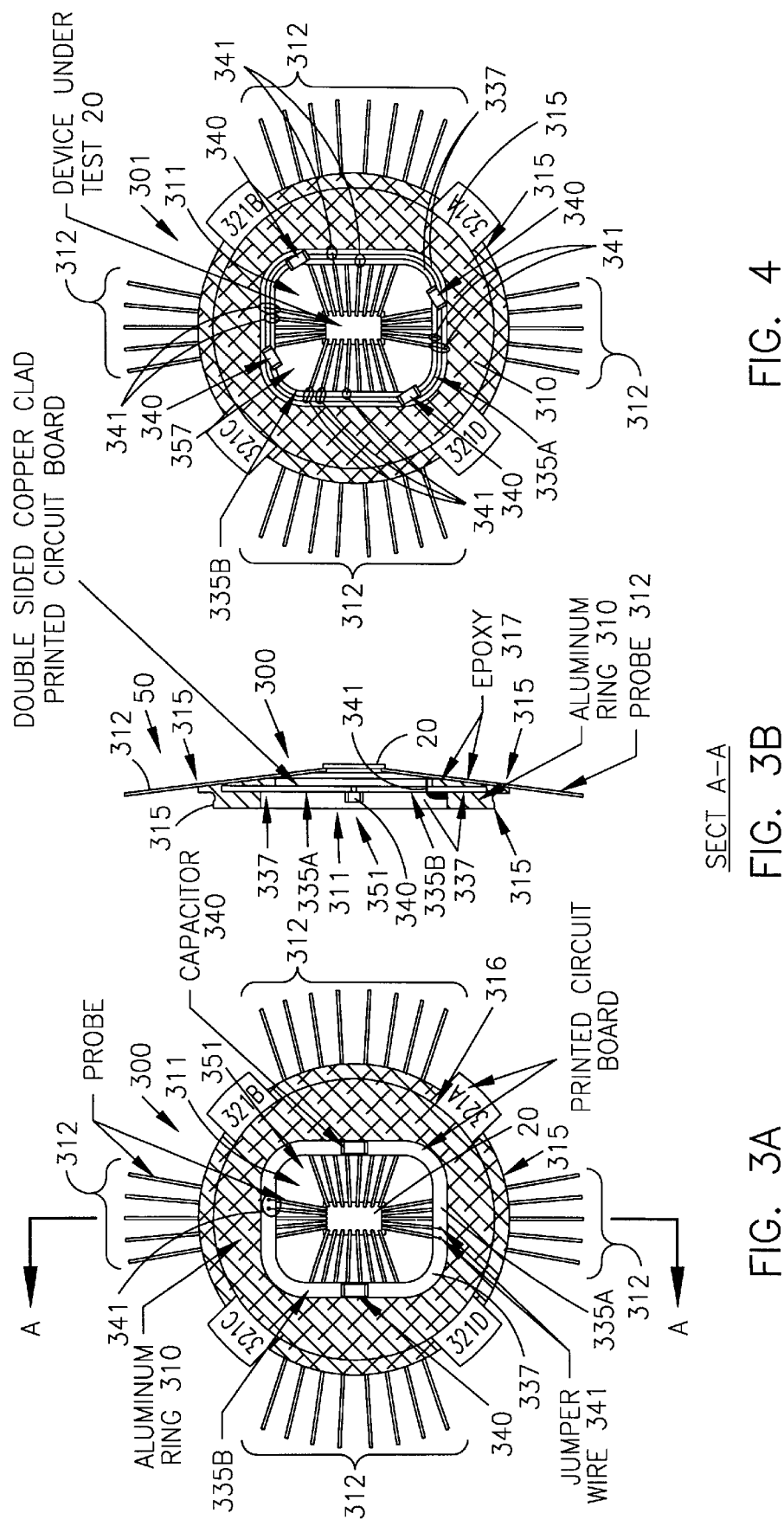

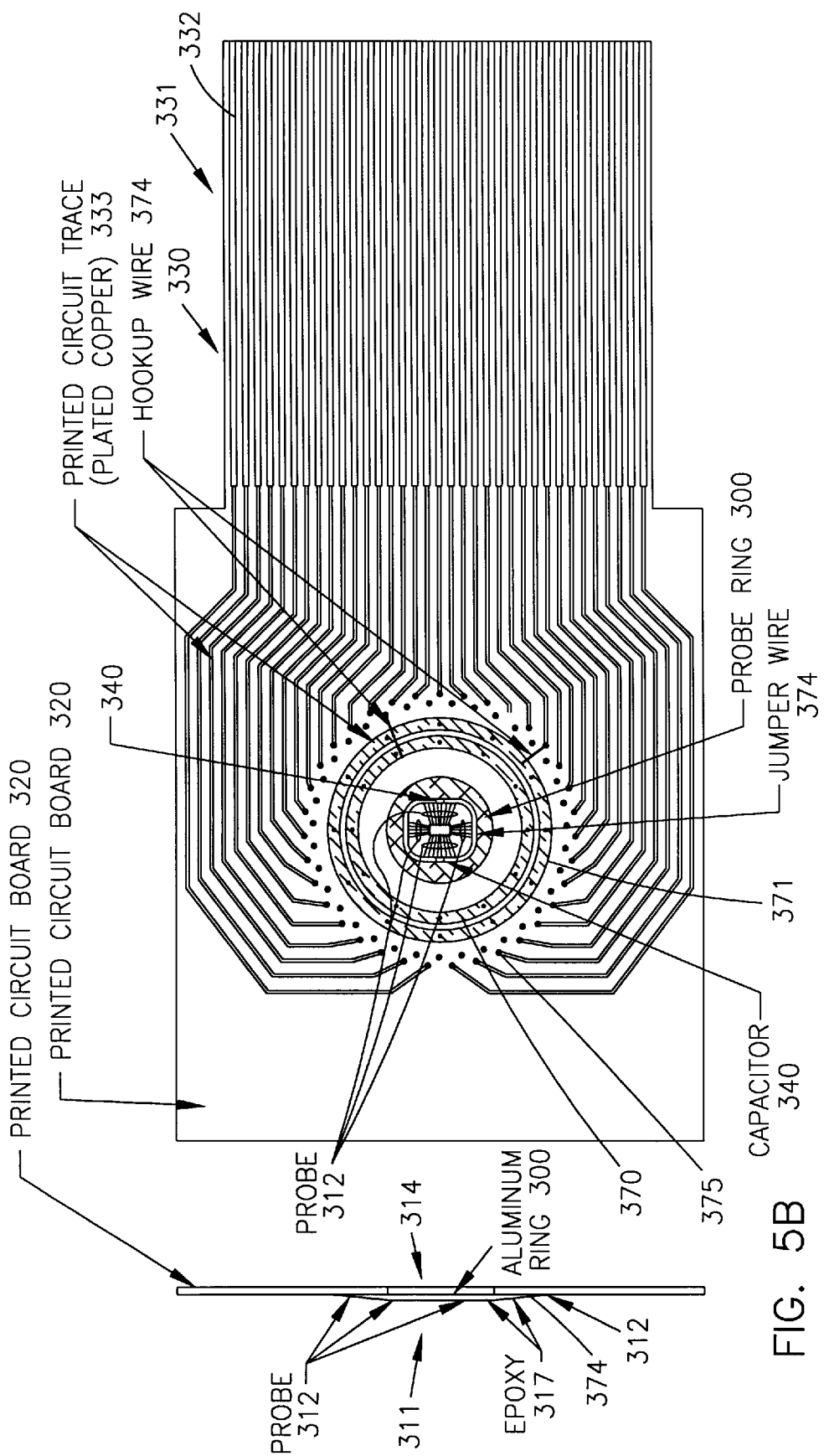

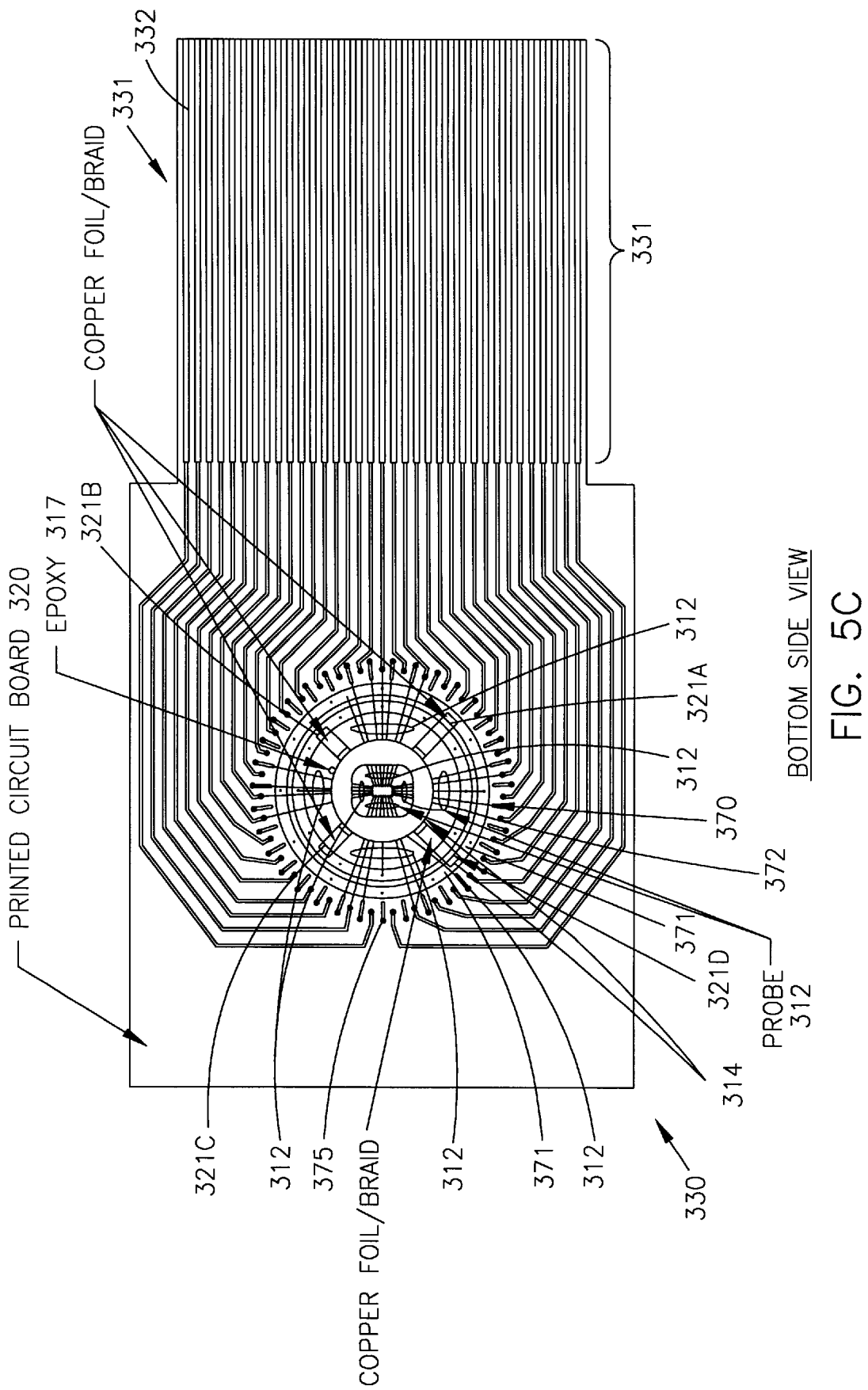

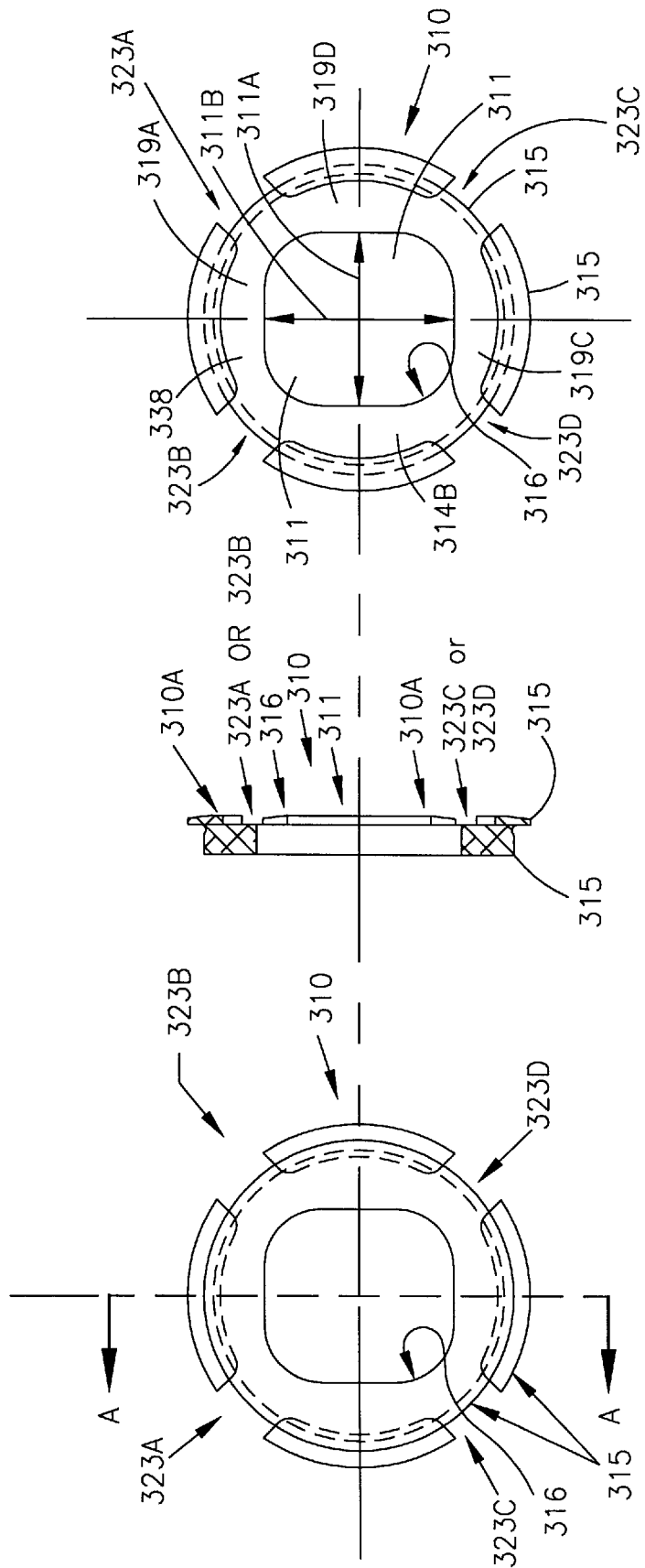

PROBE RING HAVING ELECTRICAL COMPONENTS AFFIXED THERETO AND RELATED APPARATUS AND PROCESSES

PARTIAL WAIVER OF COPYRIGHT PURSUANT TO 1077 O.G. 22(Mar. 20, 1987)

© Copyright. David M. Miley. 1996. All of the material in this patent application is subject to copyright protection under the copyright laws of the United States and of other countries. As of the first effective filing date of the present application, this material is protected as unpublished material.

However, permission to copy this material is hereby granted to the extent that the owner of the copyright rights has no objection to the facsimile reproduction by anyone of the patent document or patent disclosure, as it appears in the United States Patent and Trademark Office patent file or records, but otherwise reserves all copyright rights whatsoever.

FIELD OF INVENTION

The present invention generally relates to the field of testing equipment for integrated circuits mounted on a semiconductor substrate and, particularly, to probe cards used by various types of testing equipment to test unsevered integrated circuits formed on a semiconductor substrate generally in wafer form and related methods to use the present invention and to manufacture the present invention.

BACKGROUND

Integrated circuits or microchips (or chips) are generally manufactured on a single wafer of semiconductor material (e.g., silicon). These individual microchips are later cut out of the wafer. Each integrated circuit on each microchip has contact pads that are electrically coupled to the electrical circuits and subcircuits embedded therein. Contact pads are exposed in wafer or microchip form before the microchips are packaged and are, thus, accessible with properly designed probes. A selected number of microchips are tested by automated test equipment that utilize probe rings and probe cards which have a number of probes that access the microchips to ensure they meet design specifications.

As shown in FIGS. 1A, 1B, and 1C, a conventional probe ring assembly 50 generally consists of conventional probe ring 11 that has central opening 11 which provides access to microchip 20 to be tested, together with a series of spaced conductive individual flexible metallic needles or blades (probes) 12 arranged on conventional probe ring 10 around central opening 11. Each probe 12 extends from a location away from conventional probe ring 10 toward the center of central opening 11, traversing both the outer perimeter 15 of conventional probe ring 10 and inner perimeter 16 of central opening 11 of conventional probe ring 10. As discussed above, probes 12 are adapted to electrically contact selected contact pads on microchip 20, which are electrically coupled to the rest of the integrated circuitry embedded in microchip 20, so that electrical signals may be transmitted to and from the integrated circuit on microchip 20. These signals transmit test routines that test the functionality of specific integrated circuits embedded in microchip 20. Epoxy layer 17 holds probes 12 in position and, if necessary, electrically insulates probes 12 from each other and from conventional probe ring 10, which may consist of anodized Aluminum.

As shown in FIGS. 2A, 2B, and 2C, conventional probe ring assemblies 50 are usually designed to fit a conventional printed circuit board opening 14 in a conventional printed circuit board 20 to form a conventional probe card 30. One end of probes 12 are then soldered to selected contacts 70 on conventional printed circuit board 20 to selectively electrically couple contacts 70 to probes 12 to relay signals to and from contact pads, of microchip 20 to test selected integrated circuits embedded on microchip 20. Note contacts 70 are generally oriented in a "star-burst" pattern around conventional printed circuit board opening 14 of conventional printed circuit board 20. Conventional printed circuit board 20 aligns with central opening 11 of conventional probe ring assembly 50 when conventional probe ring assembly 50 and conventional printed circuit board 20 are fitted together. Plated-thru holes 75 are used to make electrical connections through conventional printed circuit board 20. First end 31 of conventional probe card 30 is, in turn, inserted into various types of testing equipment that are used to generate and transmit the test routines that test the functionality of the integrated circuits and subcircuits of microchip 20. Electrical components, such as capacitor 40, may be placed on conventional probe card 20 in the electrical path 33, between contacts 70 and the contact leads 32 on first end 31 of conventional printed circuit board 20, such as a printed circuit trace, which generally consists of plated copper. In addition, electrical components may be placed between bands 71 and 72 that are generally used as common ground and/or power sources. Bands 71 and 72 are, in turn, generally connected to an appropriate electrical path 33 used as a ground or power source by the testing equipment with which conventional probe card 30 interacts. These electrical components adjust or modify the electrical signals transmitted to and from the integrated circuit via conventional probe ring assembly 50 and conventional probe card 30 for a variety of reasons. For instance, capacitors 40 are generally used to increase the accuracy of the test results by reducing the overall distortion.

Conventional probe ring assemblies 50 and conventional probe cards 30 have a number of problems. For example, the placement of electrical components, such as capacitor 40, on conventional printed circuit board 20 itself slows and interrupts the transmission and reception of electrical test signals to and from the selected integrated circuits being tested. The distance between the selected integrated circuit being tested on microchip 20 and the capacitor 40 in conventional embodiments is, unfortunately, rather large in microscopic terms, which slows down the overall speed of the circuit and increases the distortion (e.g., due to the time delay associated with the capacitors and transient or ripple condition created by the capacitors). Most semiconductor manufacturers appreciate the significance of both of these factors and that conventional probe ring assemblies 50 and conventional probe cards 30 do not alleviate these concerns.

SUMMARY

The disclosed invention pertains to an apparatus or process that is used to test an integrated circuit and methods to manufacture the apparatus(es) used to test integrated circuits. An integrated circuit generally comprises a plurality of contact pads that are electrically coupled to the integrated circuit to transfer electrical signals to and from the integrated circuit. Preferred embodiments of the probe ring generally comprise a body (or ring), a plurality of probes, and at least one electrical component (e.g., capacitors, resistors, inductors, transformers, integrated circuits). The body or ring, which is preferably non-conductive and substantially circular, has a first surface and an opening to a hollow cavity extending therethrough. The ring comprises materials selected from the group consisting of ceramic, anodized aluminum, fiberglass, metal, and any combination thereof. The plurality of probes is positioned on the surface and extends from a location exterior to the ring to a location over the opening and is located proximate to the opening. The plurality of probes is attached to the ring surface. Each probe has a contact end to contact one contact pad of the plurality of contact pads. Each probe is aligned in such a way so as to orient each contact end of each probe of the plurality of probes over the opening to contact a particular contact pad. The electrical components are secured to the ring and selectively electrically coupled to particular probes of the plurality of probes.

Some preferred embodiments place an insert in a recess created in the ring, so that the insert extends out into and over the opening. The insert may be conductive and is electrically coupled to at least one probe of the plurality of probes (e.g., via jumper wires) and/or to the electrical components. The electrical component(s) are placed on the insert and, in certain cases, are electrically coupled to the plurality of contact pads and/or the insert. In fact, the insert is preferably partitioned into a plurality of portions that are electrically insulated from one another, which enables electrical contacts (e.g., leads or pads of electrical components, or probes) to be electrically coupled to various portions of the insert. The probe ring may also have an outer perimeter and the recess may extend from the ring opening to the outer perimeter and the insert may also extend from the opening to the outer perimeter. The plurality of probes are affixed to said ring surface with an adhesive (e.g., epoxy), which electrically insulates the plurality of probes from one another and from the conductive insert, if used, and the epoxy also secures the plurality of probes and, when applicable, the insert in place.

Preferred probe rings may be combined with preferred probe cards. Probe cards are generally comprised of a probe ring and a printed circuit board. The printed circuit board has a second opening therein along with a second opening perimeter. The printed circuit board also has a plurality of electrical contacts. Probes preferably have a connection end. Each connection end of each probe of the plurality of probes selectively electrically contacts one electrical contact of the plurality of electrical contacts. The electrical contacts may also be electrically coupled to the insert, when the insert is conductive. The plurality of electrical contacts selectively electrically couple the plurality of probes with testing equipment to test the integrated circuit. The perimeter of the ring conforms to the second opening perimeter, so that the ring aligns with the second opening and that the ring and the printed circuit board fit together. The printed circuit board may have a first end that is adapted to be inserted into the testing equipment. Note, however, printed circuit board can take any number of shapes, such as circular, square, rectangular, or may contact testing equipment with alternative techniques as well. Such as with pins, edge connectors, and elastomer.

Preferred processes comprise the following steps (a) providing a body having a hole therethrough; (b) creating a recess in the body, (c) placing an insert in the recess so that the insert extends out over the hole; (d) placing a plurality of probes so each probe of the plurality of probes traverses the body and terminates over the hole; (e) affixing each probe of the plurality of probes to the body with an adhesive; and (f) placing electrical components on the insert and electrically coupling the electrical components to at least one probe of the plurality of probes. Additional processes comprise electrically coupling the electrical component to the insert and (g) creating a recess in the body that extends from the hole to an outer portion of the body, and (h) placing the insert in the recess so that the insert extends from the hole to the outer portion. In addition, as described above, the resulting probe ring may be aligned and fitted with a printed circuit board to form a probe card.

Preferred embodiments provide a number of advantages. Preferred embodiments enable electrical (and electronic) components to be placed on or around the probe ring assembly, as opposed to on the printed circuit board of a probe card. This capability shortens selected conductive paths to and from the integrated circuit being tested. This capability enhances the overall speed and effectiveness of the testing procedure. For instance, the ability to position a capacitor in close proximity to the tips of the probes dramatically shortens the distance between power and ground, which reduces the overall distortion of the signals transmitted to and from the integrated circuit and increases the bandwidth of the signals transmitted. Thus, preferred embodiments improve the efficiency of testing procedures by increasing the speed and frequency and also improve the integrity of the results gained by the testing operation by reducing distortion without necessitating substantial changes in existing testing equipment or procedures. Moreover, preferred embodiments can be easily retrofitted into existing designs utilized by existing test equipment incorporating probe rings and probe card, thereby making probe rings and probe cards extremely competitive with competing technologies, such as membrane cards and blade cards.

Other advantages of the invention and/or inventions described herein will be explained in greater detail below.

BRIEF DESCRIPTION OF THE DRAWINGS

The accompanying drawings are incorporated into and form a part of the specification to illustrate several examples of the present inventions. These drawings together with the description serve to explain the principles of the inventions. The drawings are only for the purpose of illustrating preferred and alternative examples of how the inventions can be made and used and are not to be construed as limiting the inventions to only the illustrated and described examples. Further features and advantages will become apparent from the following and more particular description of the various embodiments of the invention, as illustrated in the accompanying drawings, wherein:

FIG. 1A is a top view of a conventional probe ring assembly 50;

FIG. 1B is a cross-sectional view of a conventional probe ring assembly 50;

FIG. 1C is a bottom view of a conventional probe ring assembly 50;

FIG. 2A is a top view of a conventional probe card 30 having electrical components, such as capacitor 40, affixed thereto;

FIG. 2B is a side view of a conventional probe card 30 having electrical components, such as capacitor 40, affixed thereto;

FIG. 3A is a top view of a preferred embodiment of probe ring assembly 300 having electrical components, such as capacitors 340, affixed to probe ring assembly 300;

FIG. 3B is a cross-sectional view of a preferred embodiment of probe ring assembly 300 having electrical components, such as capacitors 340, affixed to probe ring assembly 300;

FIG. 4 is a top view of an alternative preferred embodiment of second probe ring assembly 301 having electrical components, such as capacitors 340, affixed to second probe ring assembly 301;

FIG. 5A is a top view of a preferred embodiment of probe card 330;

FIG. 5B is a side view a preferred embodiment of probe card 330 with the preferred embodiment of probe ring assembly 300;

FIG. 5C is a bottom view of a preferred embodiment of probe card 330 with probe ring assembly 300;

FIG. 6A is a top view of a preferred embodiment of probe ring 310 after pocket or recess 338 has been created in the first surface 310A (exterior bottom) of probe ring 310;

FIG. 6B is a cross-sectional view of a preferred embodiment of probe ring 310 after pocket or recess 338 has been created in the first surface 310A of probe ring 310;

FIG. 6C is a bottom view of a preferred embodiment of probe ring 310 after pocket or recess 338 has been created in the bottom surface of probe ring 310.

DETAILED DESCRIPTION OF THE PREFERRED EMBODIMENT

Figure 2C:
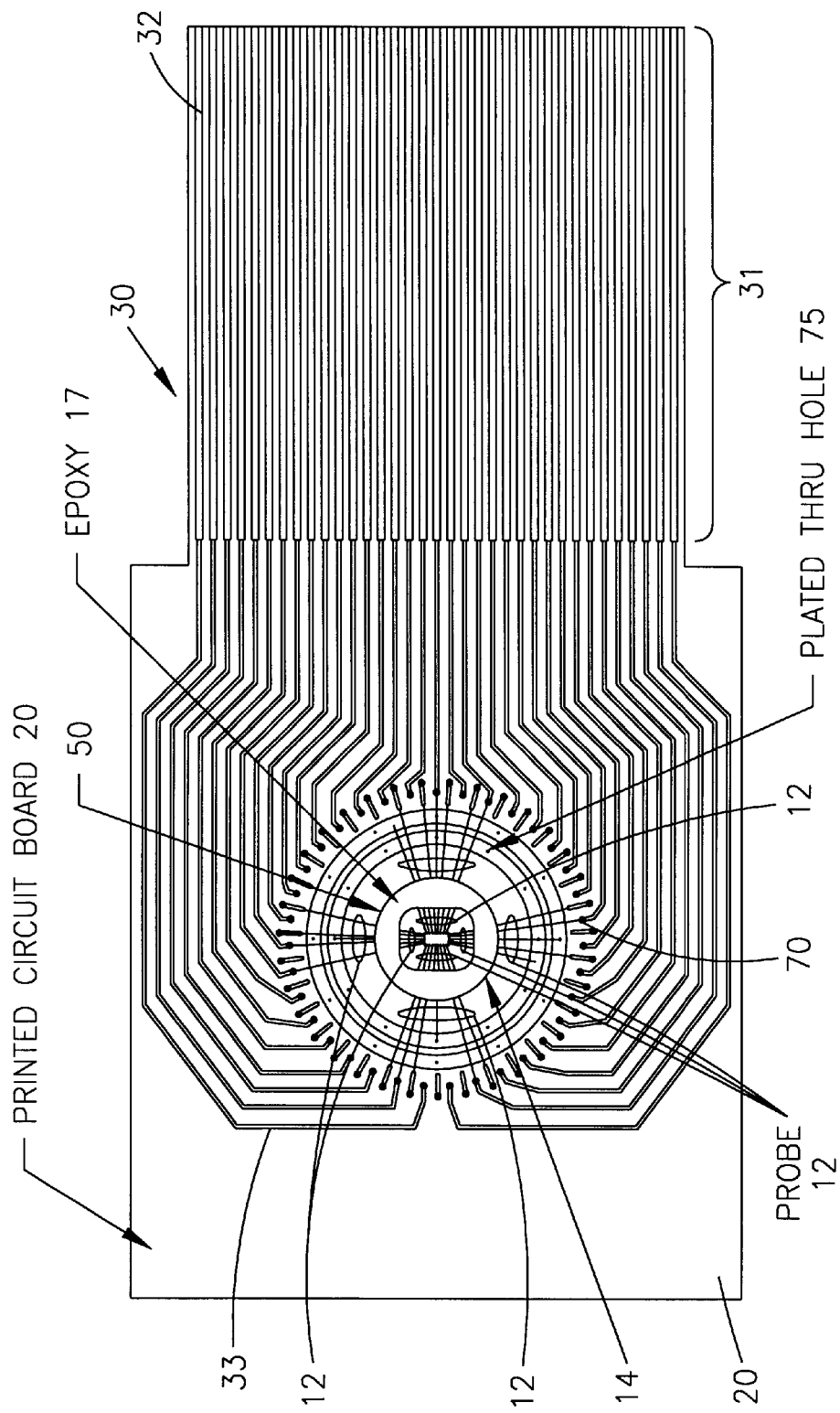
FIG. 2C is a bottom view of a conventional probe card 30 having electrical components, such as capacitor 40, affixed thereto.

The present inventions will be described by referring to apparatus and methods showing various examples of how the inventions can be made and used. When possible, like reference characters are used throughout the several views of the drawing to indicate like or corresponding parts.

As discussed above, FIGS. 1A, 1B, and 1C respectively illustrate a top view, a cross-sectional view, and a bottom view of conventional probe ring assembly 50. Similarly, FIGS. 2A, 2B, and 2C respectively illustrate a top view, a side view, and a bottom view of a conventional probe card 30 having electrical components, such as capacitor 40, affixed thereto. Once again, for a variety of reasons, the placement of electrical components on conventional printed circuit board 20 of conventional probe card 30, such as capacitors 40, is problematic.

FIGS. 3A and 3B respectively illustrate a top view and a cross-sectional view of a preferred embodiment of probe ring assembly 300 having electrical components, such as capacitors 340, affixed to probe ring assembly 300. FIG. 4 illustrates a top view of an alternate preferred embodiment of second probe ring assembly 301 having electrical components, such as capacitors 340, affixed to second probe ring assembly 301. Insert 335 is partitioned differently in probe ring assembly 300 than in second probe ring assembly 301. Insert 335 may be partitioned into any number of planes or contact areas 335A and 335B, to provide additional ground or power source on alternate signal paths. Note the discussion below pertaining to probe ring assembly 300 and second probe ring assembly 301 as well. Both preferred embodiments shown in FIGS. 3A, 3B, and 4 shorten the distance between probes 312 and power and/or ground sources by placing capacitors 340 adjacent or adjoining probe ring assembly 300 (or second probe ring assembly 301), preferably on ledge 337 inside or along inner perimeter 316 of probe ring opening 311 of probe ring assembly 300 (or second probe ring assembly 301).

Figures 7A, 7B:
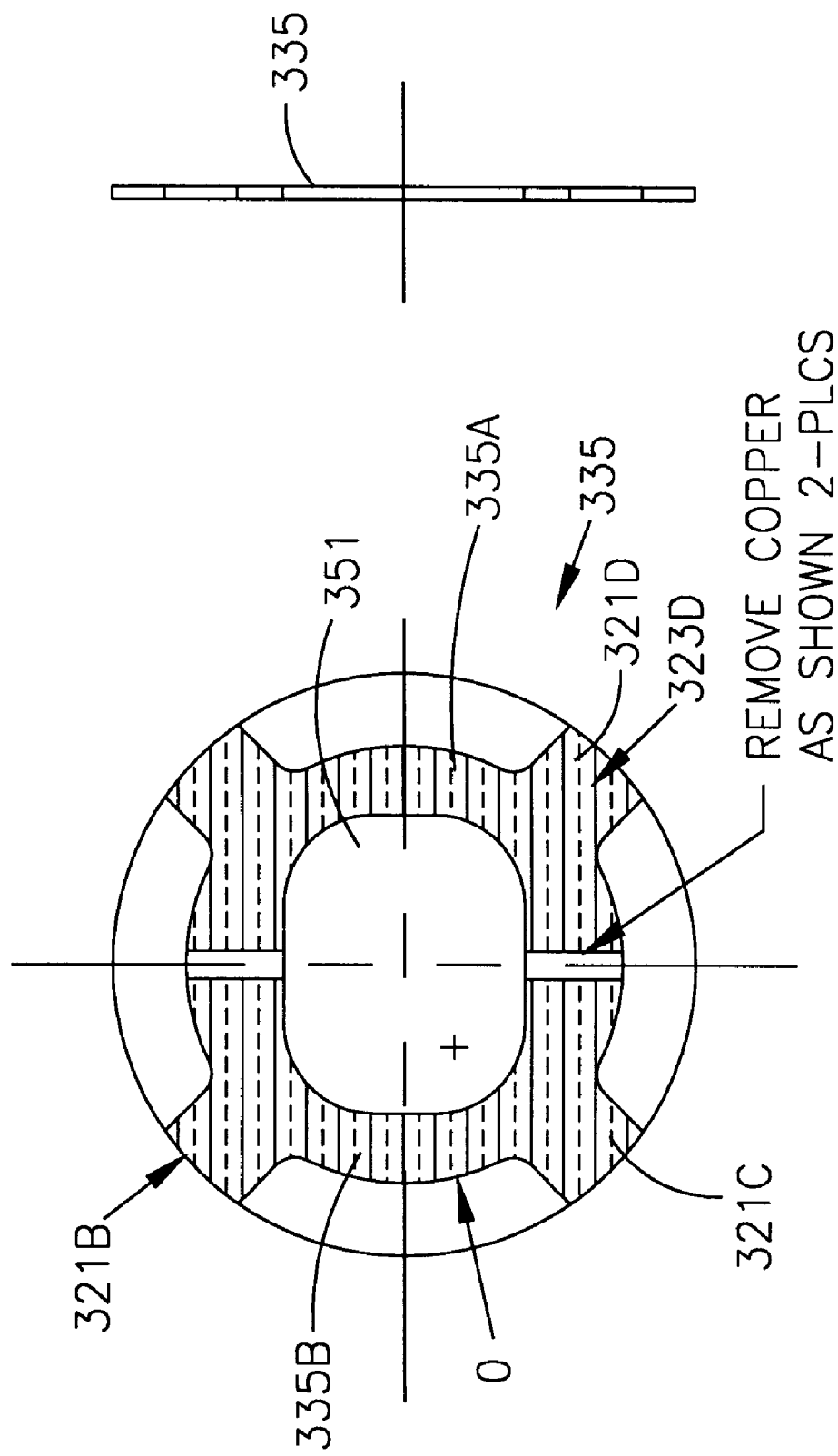
FIGS. 7A and 7B show a top view and side view of insert 335 which is placed in pocket or recess 338 in FIGS. 6A, 6B and 6C to form the preferred probe ring 310 shown in FIGS. 3A and 3B.

More specifically, as shown in FIGS. 6A, 6B, and 6C, preferred embodiments have a pocket or recess 338 machined or etched into first surface 310A (preferably the bottom surface) of probe ring 310 that substantially surrounds probe ring opening 311 of probe ring 310. As shown in FIG. 6B, first surface 310A is typically angled at 7 degrees, but may be angled at any angle, including –0– degrees. Pocket or recess 338 substantially extends around inner perimeter 316 of probe ring opening 311 to form an indentation. Recess 338 holds an appropriately fashioned insert 335. Insert 335 conducts electrical signals from the outer perimeter 315 of probe ring 310 to the inner perimeter 316 of probe ring 310. Preferred embodiments use a double-sided copper dad printed circuit board or some other acceptable electrically conductive material (e.g., screen printed ceramic to conduct the signals). FIGS. 7A and 7B show one possible shape of insert 335, which conforms with the shape of recess or pocket 338 shown in FIGS. 6A, 6B, and 6C.

Referring to FIGS. 6A, 6B, and 6C, note preferred embodiments have pocket or recess 338 divided into a plurality of areas 319A, 319B, 319C, and 319D. Referring to FIGS. 3A, 3B, and 4, insert 335 when placed in pocket or recess 338 extends out past the inner perimeter 316 of probe ring 310 (around probe ring opening 311) to form ledge 337 upon which electrical components 340 can be positioned or placed and/or to which attached, and/or electrically coupled. Insert 335 is held in place with an adhesive, such as Cyanoacrylate Ester (e.g., SuperGlue™) or an epoxy. Preferred embodiments use adhesives that are by and large electrically neutral. The depth of pocket or recess 338 is greater than the thickness of insert 335, so that when probes 312 are surrounded and/or fixed in place with epoxy 317, probes 312 are electrically isolated from one another and from insert 335. Insert 335 may also be covered with an insulation, except when removed for contact purposes. Epoxy 317 in preferred embodiments substantially covers first surface 310A and insert 335, except for the portions 321A, 321B, 321C, and 321D of insert 335 that protrude beyond the outer perimeter 315 of probe ring 310, which are called ears, arms or legs. In addition, while preferred embodiments increase the overall size (and the perimeter) of probe ring opening 311 extending through probe ring 310 than what would normally be the case, the use and placement of insert 335 actually reduces the overall size (and the perimeter) of probe ring opening 311 to what would normally be the case, thereby creating ledge 337. In particular, probe ring opening 311 of preferred probe rings 310 are generally determined by a number of factors, including the customer's application, the overall size dimensions of the integrated circuit on microchip 20 under test, the gram pressures to be exerted by each probe of probes 312, the type of material for probes 312, and the diameter of each probe of probes 312. Preferred embodiments generally increase the size of probe ring opening 311, determined by the above considerations to be appropriate, by approximately 0.05' larger along both the positive and negative X axis, as referenced by 311A in FIG. 6C, and the positive and negative Y axis, as referenced by 311B in FIG. 6C, for a total of 0.1" along the X axis 311A and a total of 0.1" along Y axis 311B. As mentioned above, insert 335 preferably has an insert opening 351 that dimensionally matches that of what would be considered the appropriate or "normal" ring opening 311 for probe ring 310, but insert 335 is 0.05" smaller on all sides (including the corners) than that of the probe ring 310. Of course, the actual amounts may vary, so long as ledge 337 is created. Note probe ring opening 311 and insert opening 351 are aligned in FIGS. 3A, 3B, and 4.

In addition, at least one channel or passageway 323A, 323B, 323C, and 323D (as shown in FIGS. 6A, 6B, and 6C)

should be added to pocket or recess 338 and fashioned such that the power and ground connections to microchip 20 (the device under test) can be routed to insert 335 of probe ring assembly 310. Preferred embodiments remove material in selected locations of an exterior surface of 310A of probe ring 310, so that insert 335 with corresponding extensions (or ears) 321A, 321B, 321C, and 321D (as shown in FIG. 7A), can extend from inner perimeter 316 of probe ring opening 311 of probe ring 310 to outer perimeter 315 of probe ring 310. Once again, the depth of this channel is preferably greater than the thickness of insert 335. As shown in FIGS. 6A, 6B, and 6C, preferred embodiments have channels or passageways 323A, 323B, 323C, and 323D at four locations that effectively form the corners of a square. In addition, insert 335 generally extends well beyond outer perimeter 315 of probe ring 310, which makes electrical connections to and from insert 335 easier to construct. For instance, referring to FIGS. 5A, 5B, and 5C, extensions or ears 321A, 321B, 321C, and 321D are selectively electrically connected to conductive bands 370 and 371. Conductive band 372 is coupled to power via one hook up wire 374, whereas conductive band 371 is coupled to ground via another hookup wire 374, or vice versa. Additional hook-up wires may be used or the connections may be made internally, externally, directly, or indirectly.

Note that insert 335 may be divided into a number of electrically isolated pieces (of varying shapes—as shown in FIG. 4), so that portion 335A of insert 335 can transmit/receive one type of signal, whereas another portion 335B of insert 335 can transmit/receive another signal. For instance, one portion may be electrically coupled to ground, whereas another portion can be electrically coupled to power. In this case, as shown in FIGS. 3A, 3B, and 4, capacitors 340, electrical components, such as may actually straddle two portions 335A and 335B of insert 335. Alternately, electrical components can merely rest on ledge 337 and be electrically connected to selected probes 312 via jumper wires 341. Appropriate portions 335A and 335B of insert 335 together form ledge 337 to which power and ground probes of probes 312 will be terminated via jumper wire(s) 341. Electrical components, such as capacitor 340, will also be mounted to or on ledge 337. Also, once again, note the varying shape of portions 335A and 335B in FIG. 4 as compared to FIGS. 3A, 7A, and 7B.

As shown in FIGS. 5A, 5B, and 5C, probe ring 300 fits printed circuit board opening 314 in printed circuit board 320 to form a probe card 330. One end of probes 312 are then soldered to selected contacts 370 on printed circuit board 320 to selectively electrically couple contacts 370 to probes 312 to relay signals to and from contact pads of microchip 20 to test selected integrated circuits embedded on microchip 20. Of course, as shown in FIG. 5B, printed circuit board opening 314 of printed circuit board 320 aligns with probe ring opening 311 of probe ring 310 when probe ring 310 and printed circuit board 320 are fitted together. Plated-thru holes 375 are used to make electrical connections through printed circuit board 320. First end 331 of probe card 330 is, in turn, inserted into various types of testing equipment that are used to generate and transmit the test routines that test the functionality of the integrated circuits and subcircuits of microchip 20. Electrical components, such as capacitor 340, may be placed on probe card 320 in the electrical path 333, between contacts 370 and the contact leads 332 on first end 331 of printed circuit board 320. In addition, electrical components may be placed between bands 371 and 372 that are generally used as common ground and/or power sources and/or, as discussed above, on ledge 337. Bands 371 and 372 are, in turn, generally coupled to an appropriate electrical path 333 used as a ground or power source by the testing equipment with which probe card 330 interacts. Note additional conductive bands may be used to provide additional power and ground sources or to transmit and receive test signals. As shown, ears 321A, 321B, 321C, and 321D, which may comprise copper foil/braid and have varying lengths, as selectively attached to bands 371 and 372. These electrical components adjust or modify the electrical signals transmitted to and from the integrated circuit via probe ring 300 and probe card 330 for a variety of reasons. As mentioned above, capacitors 340 are generally used to increase the accuracy of the test results by reducing the overall distortion as well as the speed or rate the integrated circuit being tested is coupled and decoupled to and from power and ground connections.

In addition, preferred process generally comprise the following steps (a) providing a body, such as probe ring 300 having a hole 311 therethrough; (b) creating a recess, such as 338, 323A, 323B, 323C or 323D in the body, (c) placing insert, such as insert 335 in the recess 338 so that the insert 335 extends out over hole 311; (d) placing a plurality of probes 312 so each probe of the plurality of probes 312 traverses the body and terminates over hole 311; (e) affixing each probe of the plurality of probes 312 to the body with an adhesive, such as epoxy 317; and (f) placing electrical components 340 on the insert 335 and electrically coupling the electrical components 340 to at least one probe of the plurality of probes 312. Additional processes comprise electrically coupling the electrical component 340 to the insert 335 and (g) creating a recess 338 in the body that extends from the hole 311 to an outer portion of the body; and (h) placing the insert 335 in the recess 338 so that insert 335 extends from the hole 311 to the outer portion of the body. As discussed above, printed circuit board 320 and either probe ring assembly 300 or second probe ring assembly 301 are fitted together to form probe card 330.

FURTHER MODIFICATIONS AND VARIATIONS

Although the invention has been described with reference to a specific embodiment, this description is not meant to be construed in a limiting sense. The example embodiments shown and described above are only as an example. Various modifications of the disclosed embodiment as well as alternate embodiments of the invention will become apparent to persons skilled in the art upon reference to the description of the invention. For instance, the preference of materials used for insert 335 may vary. Other conductive materials, besides copper, can be used to conduct signals. Similarly, multilayer or buried interconnect boards may be used to transmit signals. Likewise, alternate materials for probe ring 310 can be used, such as ceramic, metal, epoxy, glass, and plastic. Probes 312 should, of course, be conductive, but may comprise any number of conductive materials, such as Tungsten, Rhenium Tungsten, Beryllium Copper, Palladium, and Paliney-7™.

The shape of insert opening 351, probe ring opening 311, and printed circuit board opening 314 may vary as well. In addition, electrical connections can often be electrical couplings and may be made in a variety of ways, such as by conductive epoxy-bond, solder, wire-bond, and eutectic bond. Alternate connection mechanisms, such as plated-thru holes may be used in ears 321A, 321B, 321C, and 321D.

Thus, even though numerous characteristics and advantages of the present inventions have been set forth in the foregoing description, together with details of the structure and function of the inventions, the disclosure is illustrative only, and changes may be made in the detail, especially in matters of shape, size and arrangement of the parts within the principles of the inventions to the full extent indicated by the broad general meaning of the terms used in the attached claims. Accordingly, it should be understood that the modifications and variations suggested above and below are not intended to be exhaustive. These examples help show the scope of the inventive concepts, which are covered in the appended claims. The appended claims are intended to cover these modifications and alternate embodiments. In short, the restrictive description and drawings of the specific examples above are not intended to point out what an infringement of this patent would be, but are to provide at least one explanation of how to make and use the inventions contained herein. The limits of the inventions and the bounds of the patent protection are measured by and defined in the following claims.

What is claimed is:

1. An apparatus to test an integrated circuit, said integrated circuit having a plurality of contact pads electrically coupled to said integrated circuit, said apparatus to transfer electrical signals to and from said integrated circuit via said plurality of contact pads, comprising:

(a) a ring having a ring surface, said ring having a ring opening to a hollow cavity extending through said ring, said ring surface substantially surrounding said ring opening, said ring surface having a recess substantially surrounding said ring opening;

(b) an insert positioned in said recess and extending out into said ring opening, said inert is conductive, said insert is partitioned into a plurality of portions, said plurality of portions having a first portion and a second portion, said first portion electrically isolated from said second portion;

(c) at least one electrical component placed on said insert, said at least one electrical component having a first lead and a second lead, said first lead electrically coupled to said first portion of said plurality of portions and said second lead electrically coupled to said second portion of said plurality of portions; and (d) a plurality of probes positioned proximate to said ring surface extending from a first location exterior of said ring to a second location proximate to said ring opening, said plurality of probes affixed to said ring surface, each probe of said plurality of probes having a contact end to electrically contact one contact pad of said plurality of contact pads, each probe of said plurality of probes aligned in such a way so as to orient each contact end of each conductive probe of said plurality of probes over said ring opening to electrically contact one contact pad of said plurality of contact pads, said plurality of probes having a first probe, said first probe electrically coupled to said first portion of said plurality of portions of said insert via an electrical wire, said electrical wire electrically coupled to said first probe and to said first portion of said plurality of portions of said insert, so that said at least one electrical component is electrically coupled to a first contact pad of said plurality of contact pads via said first probe, said electrical wire and said first portion of said plurality of portions of said insert.

2. The apparatus of claim 1, wherein each probe of said plurality of probes also has a connection end, and further comprising:

(e) a printed circuit board having a second opening therein, said second opening having a second opening perimeter, said printed circuit board having a plurality of electrical contacts, each connection end of each probe of said plurality of probes selectively electrically contacts one electrical contact of said plurality of electrical contacts, said plurality of electrical contacts selectively electrically couple said plurality of probes with testing equipment to test said integrated circuit, wherein said ring has a ring perimeter and wherein said second opening perimeter conforms to said ring perimeter, so that said ring aligns with said second opening and that said ring and said printed circuit board fit together.

3. The apparatus of claim 2, wherein said printed circuit board has a first end, said first end adapted to be inserted into said testing equipment.

4. The apparatus of claim 2, wherein said probe ring has an outer perimeter and said recess extends from said ring opening to said outer perimeter and said insert also extends from said ring opening to said outer perimeter and further wherein said insert is electrically coupled to a first electrical contact of said plurality of electrical contacts of said printed circuit board.

5. The apparatus of claim 2, wherein said printed circuit board aligns with said ring.

6. The apparatus of claim 2, wherein at least one electrical contact of said plurality of electrical contacts form a conductive band which substantially extends around said second opening and further wherein at least one connection end of one probe of said plurality of probes contacts said conductive band.

7. The apparatus of claim 1, wherein said plurality of probes are affixed to said ring surface with epoxy, said epoxy electrically isolates said plurality of probes from one another and from said insert, and said epoxy also secures said plurality of probes and said insert in place.

8. The apparatus of claim 1, wherein said ring is nonconductive.

9. The apparatus of claim 1, wherein said ring is comprised of materials selected from a group consisting of ceramic, metal, epoxy, glass, and plastic.

10. The apparatus of claim 1, wherein said ring is substantially circular and comprised of stable, machinable material.

11. The apparatus of claim 1, wherein said ring opening is circular.

12. The apparatus of claim 1, wherein said probe ring has an outer perimeter and said recess extends from said ring opening to said outer perimeter and said insert also extends from said ring opening to said outer perimeter.

13. The apparatus of claim 1, wherein said at least one electrical component is selected from a group consisting of capacitors, resistors, diodes, transistors, inductors, transformers, and integrated circuits.

14. The apparatus of claim 1, wherein said second portion of said plurality of portions of said insert is selectably electrically coupled to ground.

15. The apparatus of claim 1, wherein a second probe of said plurality of probes is electrically coupled to said second portion of said plurality of portions of said insert via a second electrical wire, so that said second lead of said at least one electrical component is electrically coupled to a second contact pad of said plurality of contact pads via said second probe, said second electrical wire, and said second portion of said plurality of portions.

16. An apparatus to test an integrated circuit, said integrated circuit having a plurality of contact pads electrically coupled to said integrated circuit, said apparatus to transfer electrical signals to and from said integrated circuit via at least one contact pad of said plurality of contact pads, comprising:

(a) a body having a surface, said body having an opening therein, said surface having an indentation therein;

(b) an insert positioned in said indentation and extending out into and partially covering said opening, said insert is partitioned into a plurality of portions, said plurality of portions having a first portion and a second portion, said first portion and said second portion of said plurality of portions are electrically isolated from one another, said first portion having a first conductive portion and said second portion having a second conductive portion;

(c) at least one electrical component placed on said insert, said at least one electrical component having a first lead and a second lead, said first lead electrically coupled to said first conductive portion of said first portion of said plurality of portions of said insert, said second lead electrically coupled to said second conductive portion of said second portion of said plurality of portions of sad insert; and (d) a plurality of probes positioned over said surface and traversing said surface and terminating over said opening, said plurality of probes affixed to said surface and to said insert, each probe of said plurality of probes having a contact end to electrically contact one contact pad of said plurality of contact pads, a first probe of said plurality of probes electrically coupled to said first conductive portion of said first portion of said plurality of portions of said insert via an electrical connection, so that said first lead of said at least one electrical component is electrically coupled to a first contact pad via said first probe, said electrical connection, and said first conductive portion of said first portion of said plurality of portions of said insert.

17. The apparatus of claim 16, wherein each probe of said plurality of probes also has a connection end, and further comprising:

(c) a printed circuit board having a second opening therein, said second opening having a second opening perimeter, said printed circuit, board having a plurality of electrical contacts, each connection end of each probe of said plurality of probes selectively electrically contacts at least one electrical contact of said plurality of electrical contacts, said plurality of electrical contacts selectively electrically couples said plurality of probes with testing equipment to test said integrated circuit, wherein said body has a body perimeter and wherein said second opening perimeter conforms to said body perimeter, so that said body aligns with said second opening and that said body and said printed circuit board fit together to form a signal unit.

18. The apparatus of claim 17, wherein said printed circuit board has a first end, said first end adapted to be inserted into said testing equipment.

19. The apparatus of claim 17, wherein said body has an outer perimeter and said indentation extends from said opening to said outer perimeter and said insert also extends from said opening to said outer perimeter and further wherein said insert is electrically coupled to one electrical contact of said plurality of contact of said printed circuit board.

20. The apparatus of claim 17, wherein at least one electrical contact of said plurality of electrical contacts form a conductive band which substantially extends around said second opening and further wherein at least one connection end of one probe of said plurality of probes contacts said conductive band.

21. The apparatus of claim 16, wherein said plurality of probes is affixed to said first surface with epoxy, said epoxy electrically isolates said plurality of probes from one another and from said insert, and said epoxy also secures said plurality of probes and said insert in place.

22. The apparatus of claim 16, wherein said body is circular and comprised of a non-conductive, stable, machinable material.

23. The apparatus of claim 16, wherein said body is comprised of materials selected from a group consisting of ceramic, metal, epoxy, glass, and plastic.

24. The apparatus of claim 16, wherein said body has an outer perimeter and said indentation extends from said opening to said outer perimeter and said insert also extends from said opening to said outer perimeter.

25. The apparatus of claim 16, wherein said at least one electrical component is selected from a group consisting of capacitors, resistors, diodes, transistors, inductors, and integrated circuits.

26. The apparatus of claim 16, wherein said electrical connection is an electrical wire electrically connected to and extending from said first probe to said first conductive portion of said first portion of said plurality of portions of said insert, said electrical wire also electrically connected to said first conductive portion of said plurality of portions of said insert.

27. The apparatus of claim 16, wherein a second probe of said plurality of probes is electrically coupled to said second conductive portion of said second portion of said plurality of portions of said insert via a second electrical connection, so that said second lead of said at least one electrical component is electrically coupled to a second contact pad via said second probe, said second electrical connection, and said second conductive portion of said second portion of said plurality of portions of said insert.

28. The apparatus of claim 27, wherein said electrical connection is a first electrical wire electrically connected to and extending from said first probe to said first conductive portion of said first portion of said plurality of portions of said insert, said first electrical wire also electrically connected to said first conductive portion of said first portion of said plurality of portions of said insert, further wherein said second electrical connection is a second electrical wire electrically connected to and amending from said second probe to said second conductive portion of said second portion of said plurality of portions of said insert, said second electrical wire also electrically connected to said second conductive portion of said second portion of said plurality of portions of said insert.

29. An apparatus to test an integrated circuit, said integrated circuit having a plurality of contact pads electrically coupled to said integrated circuit, said apparatus to transfer electrical signals to and from said integrated circuit via at least one contact pad of said plurality of contact pads, comprising:

(a) a ring having a ring surface, said ring having a ring opening in said ring surface to a hollow cavity extending through said ring;

(b) a plurality of probes extending from a first location exterior of said ring to a second location over said ring opening, said plurality of probes affixed to said ring with an adhesive, each probe of said plurality of probes having a contact end to electrically contact one contact pad of said plurality of contact pads and wherein each probe of said plurality of probes also has a connection end;

(c) at least one electrical component secured to said ring near said ring opening, said at least one electrical component selectably electrically coupled to said plurality of contact pads; and (d) a printed circuit board having a second opening therein, said second opening, having a second opening perimeter, said printed circuit board having a plurality of electrical contacts, each connection end of each probe of said plurality of probes selectively electrically contacts at least one electrical contact of said plurality of electrical contacts, said plurality of electrical contacts selectively electrically couples said plurality of probes with testing equipment to test said integrated circuit, wherein said ring has a ring perimeter and wherein said second opening perimeter conforms to said ring perimeter, so that said ring aligns with said second opening and that said ring and said printed circuit board fit together to form a signal unit, wherein at least one electrical contact of said plurality of electrical contacts form a conductive band which substantially extends around said second opening and further wherein at least one connection end of one probe of said plurality of probes contacts said conductive band.

30. The apparatus of claim 29, further comprising (e) a conductive plate secured to said ring, said conductive plate electrically coupled to at least one probe of said plurality of probes and to said at least one electrical component.

31. The apparatus of claim 30, wherein said ring has an indentation extending from said ring opening to an outer portion of said ring and said conductive plate is positioned in said indentation and also extends from said ring opening to said outer portion.

32. The apparatus of claim 30, wherein said conductive plate is partitioned into a plurality of portions, said plurality of portions having a first portion and a second portion, each portion of said plurality of portions electrically isolated from one another, said at least one electrical component having a first electrical connection and a second electrical connection, said first electrical connection electrically coupled to said first portion of said plurality of portions and said second electrical connection electrically coupled to a second portion of said plurality of portions.

33. The apparatus of claim 32, further wherein at least one portion of said plurality of portions is electrically coupled to at least one probe of said plurality of probes.

34. The apparatus of claim. 29, wherein said plurality of probes is affixed to said ring with epoxy, said epoxy electrically isolates said plurality of probes from one another, and said epoxy also secures said plurality of probes in place.

35. The apparatus of claim 29, wherein said ring is circular and comprised of a non-conductive, stable, machinable material.

36. The apparatus of claim 29, wherein said printed circuit board has a first end, said first end adapted to be inserted into said testing equipment.

37. The apparatus of claim 29 wherein said at least one electrical component is selected from a group consisting of capacitors, resistors, diodes, transistors, inductors, and integrated circuits.

38. A process, comprising the following steps:
(a) providing a body having a hole therethrough;
(b) creating a recess in said body;
(c) placing an insert in said recess so that said insert extends out over said hole;
(d) placing a plurality of probes so that each probe of said plurality of probes traverses said body and terminates over said hole;
(e) affixing each probe of said plurality of probes to said body with an adhesive; and
(f) placing electrical components on said insert and electrically coupling said electrical components to at least one probe of said plurality of probes.

39. The process of claim 38, wherein said body is a non-conductive ring and said adhesive is an epoxy and said insert is conductive and comprising the following step of (g) electrically coupling said electrical component to said insert.

40. The process of claim 38, wherein said recess extends from said hole to an outer portion of said body, and further comprising the following step
(g) placing said insert in said recess so that said insert extends from said hole to said outer portion.

* * * * *